United States Patent
Riel et al.

(10) Patent No.: US 10,343,899 B2
(45) Date of Patent: Jul. 9, 2019

(54) METHOD FOR WAFER-LEVEL MANUFACTURING OF OBJECTS AND CORRESPONDING SEMI-FINISHED PRODUCTS

(71) Applicant: ams Sensors Singapore Pte. Ltd., Singapore (SG)

(72) Inventors: Peter Riel, Bäch (CH); Hartmut Rudmann, Jona (CH); Markus Rossi, Jona (CH)

(73) Assignee: ams Sensors Singapore Pte. Ltd., Singapore (SG)

( * ) Notice: Subject to any disclaimer, the term of this patent is extended or adjusted under 35 U.S.C. 154(b) by 829 days.

(21) Appl. No.: 14/346,804

(22) PCT Filed: Oct. 1, 2012

(86) PCT No.: PCT/CH2012/000230
§ 371 (c)(1),
(2) Date: Mar. 24, 2014

(87) PCT Pub. No.: WO2013/049948
PCT Pub. Date: Apr. 11, 2013

(65) Prior Publication Data
US 2014/0295122 A1    Oct. 2, 2014

Related U.S. Application Data

(60) Provisional application No. 61/544,005, filed on Oct. 6, 2011.

(51) Int. Cl.
*H01L 27/146* (2006.01)
*B81B 7/04* (2006.01)
*B81C 1/00* (2006.01)

(52) U.S. Cl.
CPC ............ *B81B 7/04* (2013.01); *B81C 1/00904* (2013.01); *H01L 27/14618* (2013.01);
(Continued)

(58) Field of Classification Search
CPC ......... H01L 27/14685; H01L 27/14683; H01L 27/14618; G02B 6/0028; G02B 6/0013;
(Continued)

(56) References Cited

U.S. PATENT DOCUMENTS 9,164,358 B2 * 10/2015 Rudmann ............ G02B 6/0011
2010/0091630 A1   4/2010 Furuyashiki
(Continued)

FOREIGN PATENT DOCUMENTS

EP       1 244 151      9/2002

OTHER PUBLICATIONS

European Patent Office, International Search Report for International Patent Application No. PCT/CH2012/000230 (dated Dec. 5, 2012).

*Primary Examiner* — Andrew Q Tran
(74) *Attorney, Agent, or Firm* — Fish & Richardson P.C.

(57) ABSTRACT

The method for manufacturing an object comprises the steps of (a) providing a wafer comprising a multitude of semi-finished objects; (b) separating said wafer into parts referred to as sub-wafers, at least one of said sub-wafers comprising a plurality of said semi-finished objects; (c) processing at least a portion of said plurality of semi-finished objects by subjecting said at least one sub-wafer to at least one processing step; and preferably also the step of (d) separating said at least one sub-wafer into a plurality of parts.

15 Claims, 5 Drawing Sheets

(52) U.S. Cl.
CPC .. *H01L 27/14685* (2013.01); *H01L 27/14696* (2013.01); *H01L 2924/0002* (2013.01); *Y10T 29/49002* (2015.01); *Y10T 428/18* (2015.01)

(58) Field of Classification Search
CPC ... G02B 6/0046; G02B 6/0033; G02B 6/0075
See application file for complete search history.

(56) References Cited

U.S. PATENT DOCUMENTS

| | | | |
|---|---|---|---|
| 2013/0088845 A1* | 4/2013 | Rudmann | G02B 6/0011 362/16 |
| 2013/0286686 A1* | 10/2013 | Kettunen | G02B 6/0011 362/623 |
| 2014/0295122 A1* | 10/2014 | Riel | H01L 27/14618 428/54 |
| 2017/0160523 A1* | 6/2017 | Wolterink | G02B 13/0085 |

* cited by examiner

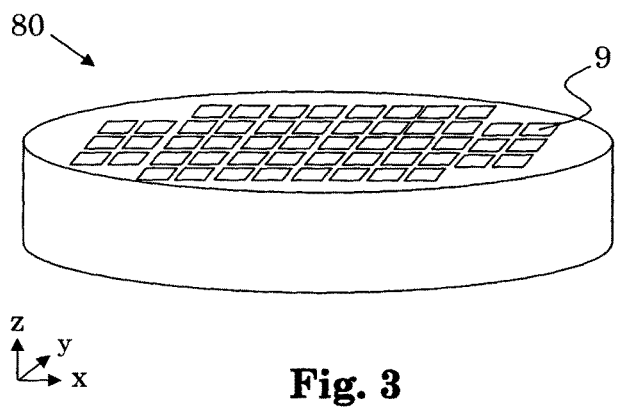
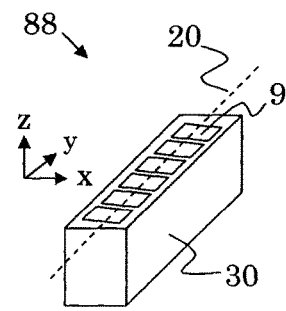
Fig. 3          Fig. 4
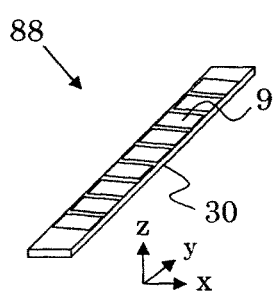
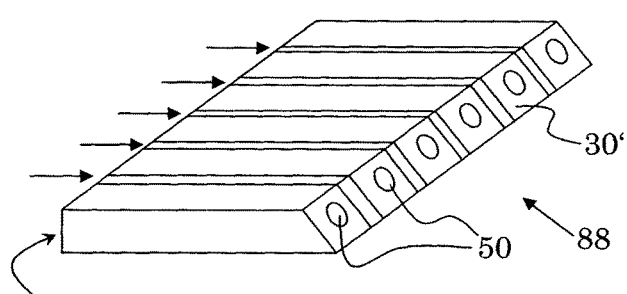
Fig. 5          Fig. 6
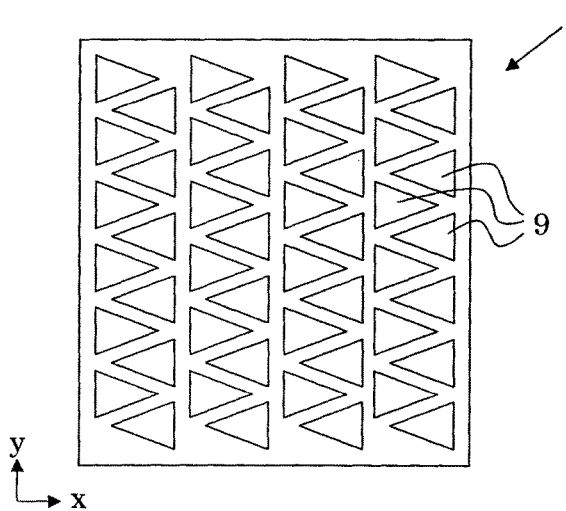
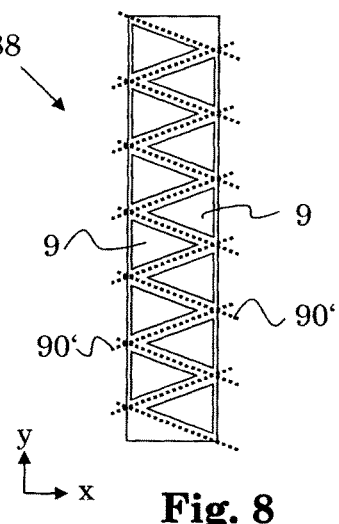
Fig. 7          Fig. 8

METHOD FOR WAFER-LEVEL MANUFACTURING OF OBJECTS AND CORRESPONDING SEMI-FINISHED PRODUCTS

RELATED APPLICATIONS

Incorporated by reference is U.S. provisional application with Ser. No. 61/418,017 filed on Nov. 30, 2010 and the PCT application published on Jun. 7, 2012 with publication number WO 2012/071674 A1 claiming priority of said U.S. provisional application 61/418,017.

TECHNICAL FIELD

The invention relates to a novel method for manufacturing objects, in particular small objects, and to a corresponding semi-finished product. More particularly, it relates to wafer-level manufacturing of objects. The invention relates to methods and products according to the opening clauses of the claims. The invention may find application, e.g., in the fields of micro-optics, micro-mechanics, micro-electromechanics and microelectronics.

BACKGROUND OF THE INVENTION

Wafer-level processing of objects such as optical systems and micro-electromechanical systems (MEMS) and microelectronic devices are well known in the art. Various types of processes such as replication processes, lithographic process and coating processes are widely applied. Wafer-level processing usually saves processing time and costs and can result in an increased reproducibility.

Definition of Terms

"Active optical component": A light sensing or a light emitting component. E.g., a photodiode, an image sensor, an LED, an OLED, a laser chip. An active optical component can be present as a bare die or in a package, i.e. as a packaged component.

"Passive optical component": An optical component redirecting light by refraction and/or diffraction and/or reflection such as a lens, a prism, a mirror, or an optical system, wherein an optical system is a collection of such optical components possibly also comprising mechanical elements such as aperture stops, image screens, holders.

"Opto-electronic module": A component in which at least one active and at least one passive optical component is comprised.

"Replication": A technique by means of which a given structure or a negative thereof is reproduced. E.g., etching, embossing, imprinting, casting, molding.

"Wafer": A substantially disk- or plate-like shaped item, its extension in one direction (z-direction or vertical direction) is small with respect to its extension in the other two directions (x- and y-directions or lateral directions). Usually, on a (non-blank) wafer, a plurality of like structures or items are arranged or provided therein, typically on a rectangular grid. A wafer may have opening or holes, and a wafer may even be free of material in a predominant portion of its lateral area. A wafer may have any lateral shape, wherein round shapes and rectangular shapes are very common. Although in many contexts, a wafer is understood to be prevailingly made of a semiconductor material, in the present patent application, this is not required. Accordingly, a wafer may prevailingly be made of, e.g., a semiconductor material, a polymer material, a glass material, a hardenable material such as thermally or UV-curable polymer, a composite material comprising metals and polymers or polymers and o glass materials.

"Lateral": cf. "Wafer"

"Vertical": cf. "Wafer"

SUMMARY OF THE INVENTION

The inventors found that new aspects can be added to wafer-level processing. More particularly, they realized that, after processing of a wafer in a conventional way, it can be of interest to divide the wafer into parts ("sub-wafers") and to further process these parts before they are further divided for eventually obtaining objects that were to be actually manufactured. In a slightly different view, the inventors suggest to interrupt the separating process ("dicing"), apply some processing to the so-obtained parts—we refer to these parts as "sub-wafer"—and thereafter finish the separating process. The processing applied on sub-wafer level can be superior to corresponding processing that would be applied to single objects after a completed dicing process, because a plurality or a multitude of semi-finished objects will usually be comprised in a sub-wafer such that process steps can be applied to a plurality or a multitude of semi-finished objects at a time or in a well-defined way to each of a plurality or a multitude of semi-finished objects one after the other.

Another possible aspect to the invention is that by dividing a (pre-processed) wafer into parts (sub-wafers), side walls or separation faces of the sub-wafer are made available which are not accessible or not existent in the undivided wafer. These side walls or separation faces can then be subjected to some processing. This can allow the manufacture of objects that are not manufacturable in conventional wafer-level processes, and compared to applying similar processing to single semi-finished objects, a higher precision and/or an improved handing and/or a higher manufacturing speed can be achievable. Conventional wafer-level manufacturing concentrates on processes applied to a lateral plane of the wafer, whereas the invention may provide access to cutting edges or vertical (side) planes in the wafer.

The sub-wafer as such is a semi-finished product inheriting these possible advantages.

It is one object of the invention to create a novel way of manufacturing objects, in particular small objects such as (micro-)optical elements, (micro-)optical devices, (miniaturized) light-guiding devices, (miniaturized) light guide elements, micro-mechanical elements, micro-electro-mechanical elements, and micro-electro-mechanical systems. In particular, a new method for manufacturing an object shall be provided as well as a corresponding semi-finished product.

Another object of the invention is to provide a way of manufacturing objects which provides an improved handling during the manufacturing, in particular in wafer-level manufacturing.

Another object of the invention is to provide an improved process stability in the manufacture of objects, in particular in wafer-level manufacturing.

Another object of the invention is to provide an improved manufacturability in wafer-level manufacturing of objects.

Another object of the invention is to provide a way of manufacturing objects which are not manufacturable in conventional wafer-level manufacturing, and in particular, to do so in a particularly efficient manner.

Another object of the invention is to provide an increased manufacturing speed in the manufacture of objects, in particular of small objects, more particularly of objects partially manufacturable on wafer-level.

Another object of the invention is to provide new ways of mass production of objects, in particular of small objects, more particularly of objects partially manufacturable on wafer-level.

Another object of the invention is to provide new ways of mass production of optical devices and/or optical elements, in particular of light guide elements or of devices comprising a light guide.

Further objects emerge from the description and embodiments below.

At least one of these objects is at least partially achieved by apparatuses and methods according to the patent claims.

The method for manufacturing an object comprises the steps of (a) providing a wafer comprising a multitude of semi-finished objects;

(b) separating said wafer into parts referred to as sub-wafers, at least one of said sub-wafers comprising a plurality of said semi-finished objects;

(c) processing at least a portion of said plurality of semi-finished objects by subjecting said at least one sub-wafer to at least one processing step.

This makes possible to subject some of the semi-finished objects comprised in a wafer to a different processing than others of the semi-finished objects comprised in the wafer. And it also makes possible to subject some or, more typically all of the semi-finished objects comprised in a wafer to some processing, e.g., to one and the same processing, after said separating. It may make possible to apply processing to separating faces, in particular to one or more separating faces obtained in said separating.

Usually, said sub-wafer is a contiguous part.

It is possible to provide that all semi-finished objects of the wafer are comprised in one sub-wafer, but usually, only a portion of the semi-finished objects of the wafer are comprised in one sub-wafer. Typically, two or more sub-wafers are obtained by said separating (step (b)) each comprising one or, more typically, a plurality of the semi-finished objects.

Usually, semi-finished objects are like objects. But it is also possible to provide, e.g., two different sorts of semi-finished objects in a wafer and also in a sub-wafer.

It is furthermore possible to provide that all sub-wafers obtained in step (b) (a sub-wafer is usually meant to comprise at least one semi-finished object) are subjected to one or more like processing steps, e.g., in case like objects are to be manufactured; but it is also thinkable to subject some of the sub-wafers obtained in step (b) to one or more processing steps different from one or more processing steps applied to others of the sub-wafers obtained in step (b).

A wafer can be a wafer stack. Thus, a wafer may comprise or, more particularly, may consist of two or more wafers attached to each other (such that their lateral planes are parallel to each other).

Usually, in a wafer, there are at least four, more particularly at least ten of said semi-finished objects arranged next to each other along the x- and along the y-direction. And in many cases, there are, in a wafer, at least ten, more particularly at least thirty of said semi-finished objects arranged next to each other along a lateral direction.

Usually, in a sub-wafer, there are at least four, more particularly at least ten, or often even more than thirty of said semi-finished objects arranged next to each along one direction.

Usually, said at least one processing step is different from separating said at least one sub-wafer into parts. The claimed invention shall certainly be different from the well-known separating process (often referred to as "dicing") usually applied in conventional wafer-level processing.

In one embodiment, step (c) is carried out while said plurality of said semi-finished objects is comprised in said sub-wafer.

In one embodiment which may be combined with the before-addressed embodiment, step (c) is carried out before a separating step for separating said at least one sub-wafer is carried out.

In one embodiment which may be combined with one or both of the two last-addressed embodiments, said at least one processing step is applied to a separation face of said sub-wafer originating from step (b). Such a separation face is not accessible in conventional wafer-level processing. Therefore, this opens up the possibility to manufacture objects in mass-production which are not manufacturable in conventional wafer-level processing. And the processing of sub-wafers may, with respect to the processing of single semi-finished products, provide higher production speed, and/or a higher accuracy and/or higher precision of manufactured objects, and/or an improved handling during the processing.

In one embodiment which may be combined with one or more of the before-addressed embodiments, said portion comprises at least two of said plurality of semi-finished objects.

In one embodiment which may be combined with one or more of the before-addressed embodiments, said portion comprises at least half of said plurality of semi-finished objects. Note that this way, in case of three semi-finished objects in the sub-wafer (forming said "plurality"), two or all three of them will be processed.

In one embodiment which may be combined with one or more of the before-addressed embodiments, in step (c), all the semi-finished objects of said portion of said plurality of semi-finished objects are simultaneously processed; or the semi-finished objects of said portion of said plurality of semi-finished objects are subsequently processed.

In the first case, an increased overall manufacturing speed will usually be achievable.

E.g., a mechanical processing step such as a polishing step may be applied to the semi-finished objects, in particular to all of the semi-finished objects of the sub-wafer, all at the same time.

In the second case, an improved handling and/or an increased overall manufacturing speed will usually be achievable. E.g., optical structures may be subsequently applied by applying an embossing process to the semi-finished objects, in particular to each of the semi-finished objects of the sub-wafer. An embossing process typically comprises applying a replication material, replicating the structure therein by embossing, and hardening the replication material.

In one embodiment which may be combined with one or more of the before-addressed embodiments, all the semi-finished objects of a first group of said plurality of semi-finished objects are processed (in particular simultaneously processed), and subsequently, all the semi-finished objects of a second group of said plurality of semi-finished objects are processed (in particular simultaneously processed), wherein, in particular, said first and second groups do not share semi-finished objects and form, together, said plurality of semi-finished objects.

In one embodiment which may be combined with one or more of the before-addressed embodiments, in step (c), each of said semi-finished objects of said at least one sub-wafer is processed by subjecting said at least one sub-wafer to at least one processing step.

In one embodiment which may be combined with one or more of the before-addressed embodiments, at least two of said sub-wafers comprise a plurality of said semi-finished objects each. In particular, the method may furthermore comprise carrying out, for each of said at least two sub-wafers, the step of (c') processing at least a portion of the respective plurality of semi-finished objects of the respective sub-wafer by subjecting the respective sub-wafer to said at least one processing step.

In one embodiment which may be combined with one or more of the before-addressed embodiments, in said at least one sub-wafer, said plurality of said semi-finished objects forms a repetitive one-dimensional arrangement of said semi-finished objects.

In one embodiment which may be combined with one or more of the before-addressed embodiments, in said at least one sub-wafer, said plurality of said semi-finished objects is arranged along one or two straight lines, in particular along one straight line.

In one embodiment which may be combined with one or more of the before-addressed embodiments, said at least one processing step comprises a replication step, in particular an embossing step.

In one embodiment which may be combined with one or more of the before-addressed embodiments, said at least one processing step comprises a mechanical processing step.

In one embodiment which may be combined with one or more of the before-addressed embodiments, said at least one processing step comprises a polishing step.

In one embodiment which may be combined with one or more of the before-addressed embodiments, said at least one processing step comprises a grinding step.

In one embodiment which may be combined with one or more of the before-addressed embodiments, said at least one processing step comprises a cutting step, in particular a cutting step producing at least one cut face having a surface normal inclined with respect to the vertical. The term "vertical" of course refers to the shape of the wafer.

In one embodiment which may be combined with one or more of the before-addressed embodiments, said at least one processing step comprises a chemical processing step.

In one embodiment which may be combined with one or more of the before-addressed embodiments, said at least one processing step comprises a lithographic step.

In one embodiment which may be combined with one or more of the before-addressed embodiments, said at least one processing step comprises a coating step.

In one embodiment which may be combined with one or more of the before-addressed embodiments, said at least one processing step comprises an etching step.

In one embodiment which may be combined with one or more of the before-addressed embodiments, said at least one processing step comprises creating a slanted side wall of said sub-wafer, slanted with respect to the lateral plane. In particular, said creating said slanted side wall is accomplished by removing material from said sub-wafer.

In one embodiment which may be combined with one or more of the before-addressed embodiments, said object is at least one of the group consisting of
an optical element;
an optical device;
substrate, in particular a substrate comprising at least one slanted face and/or a substrate for an optical assembly or for an optical sub-assembly;
an optical sub-assembly, in particular an optical sub-assembly comprising a substrate on which a light emitter is mounted, more particularly wherein said substrate has at least one slanted face and/or wherein said light emitter is an edge-emitting light emitter and/or a laser;
an opto-electronic module;
an optical system;
a light-guiding device, in particular a light guide element;
a micro-mechanical element;
a micro-electro-mechanical element;
a micro-electro-mechanical system.

In one embodiment which may be combined with one or more of the before-addressed embodiments, said wafer is at least partially, in particular prevailingly, made of a transparent material. In particular, said wafer is at least partially or is prevailingly made of a transparent polymer or of a glass.

In one embodiment which may be combined with one or more of the before-addressed embodiments, the method comprises carrying out, after carrying out step (c), the step of (d) separating said at least one sub-wafer into a plurality of parts.

In particular, each part comprises one of said processed semi-finished objects, more particularly wherein one of said parts is said object to be manufactured.

In one embodiment which may be combined with one or more of the before-addressed embodiments, the method comprises carrying out, before carrying out step (b), the step of (e) manufacturing said wafer.

The sub-wafer itself usually is a semi-finished product and constitutes an aspect of the invention. More specifically, we refer to a semi-finished product with the following properties:

The semi-finished product comprises a side wall running along a straight line and a plurality of semi-finished objects, at least a portion of said plurality of semi-finished objects being arranged along a line parallel to said side wall, in particular wherein said portion comprises at least three of said plurality of semi-finished objects.

The semi-finished objects will in many cases be like objects.

Typically, the semi-finished product comprises at least six semi-finished objects in a row, or even at least ten in a row.

In one product embodiment, all of said plurality of semi-finished objects are arranged along a line parallel to said side wall.

In one product embodiment which may be combined with the last-addressed embodiment, the semi-finished product is of bar- or plate- or rod-shape.

In one product embodiment which may be combined with one or both last-addressed embodiments, each of said semi-finished objects of said portion of said plurality of semi-finished objects comprises a face formed by said side wall, in particular wherein each of said semi-finished objects of said plurality of semi-finished objects comprises a face formed by said side wall.

In one product embodiment which may be combined with one or more of the before-addressed product embodiments, all of said plurality of semi-finished objects are arranged along one or two lines parallel to said side wall, in particular along one such line.

In one product embodiment which may be combined with one or more of the before-addressed product embodiments, said side wall is slanted. In particular, said side wall is slanted with respect to the lateral plane defined by the shape of the semi-finished product.

In one product embodiment which may be combined with one or more of the before-addressed product embodiments, said side wall is provided with at least one of the group consisting of a coating;

a replicated structure, in particular a structure obtained using embossing;

an optical structure, in particular wherein said optical structure comprises curved faces and/or comprises refractive and/or diffractive elements;

a passive optical component directly or indirectly attached to said side wall;

an active optical component directly or indirectly attached to said side wall.

In case of replicated structures, optical structures, passive optical components and active optical components, there will usually be more than one of the respective items provided, more particularly at least one of the respective items for each of said plurality of semi-finished objects.

The invention comprises semi-finished products with features of corresponding methods according to the invention, and, vice versa, also methods with features of corresponding semi-finished products according to the invention.

The advantages of the semi-finished products basically correspond to the advantages of corresponding methods, and, vice versa, the advantages of the methods basically correspond to the advantages of corresponding semi-finished products.

Since objects manufactured according to the invention may be comprised in a device, also methods for manufacturing a device comprising at least one such object may form an aspect of the invention. This concerns in particular the following methods:

A method for manufacturing a device, said device comprising at least one object, the method comprising manufacturing said at least one object according to a method according to the invention, see above.

This method comprises in one embodiment the step of attaching said at least one object to at least one other constituent of said device, in particular mounting said at least one object at a housing of said device or inside a housing of said device.

Said device can be at least one of the group consisting of an electronic device, in particular hand-held electronic device;

an electro-optic device;

a hand-held device, in particular a hand-held optics device;

a communication device, in particular a mobile communication device;

a smart phone;

a digital music player;

a photographic device, in particular a photo camera and/or a video camera.

For the manufacture of devices for which high integration and/or miniaturization and/or mass production is a requirement or at least advantageous, the method can be particularly valuable.

Further embodiments and advantages emerge from the dependent claims and the figures.

BRIEF DESCRIPTION OF THE DRAWINGS

Below, the invention is described in more detail by means of examples and the included drawings. The figures show:

FIG. 3 a schematic illustration of a wafer comprising a multitude of semi-finished objects, in a perspective view;

FIG. 4 a schematic illustration of a sub-wafer as obtainable from the wafer of FIG. 3, in a perspective view;

FIG. 5 a schematic illustration of a sub-wafer, in a perspective view;

FIG. 6 a schematic illustration of a processed sub-wafer, in a perspective view;

FIG. 7 a schematic illustration of a wafer comprising a multitude of semi-finished objects, in a top view;

FIG. 8 a schematic illustration of a sub-wafer as obtainable from the wafer of FIG. 7, in a top view;

The described embodiments are meant as examples and shall not confine the invention.

DETAILED DESCRIPTION OF THE INVENTION

Figure 1:
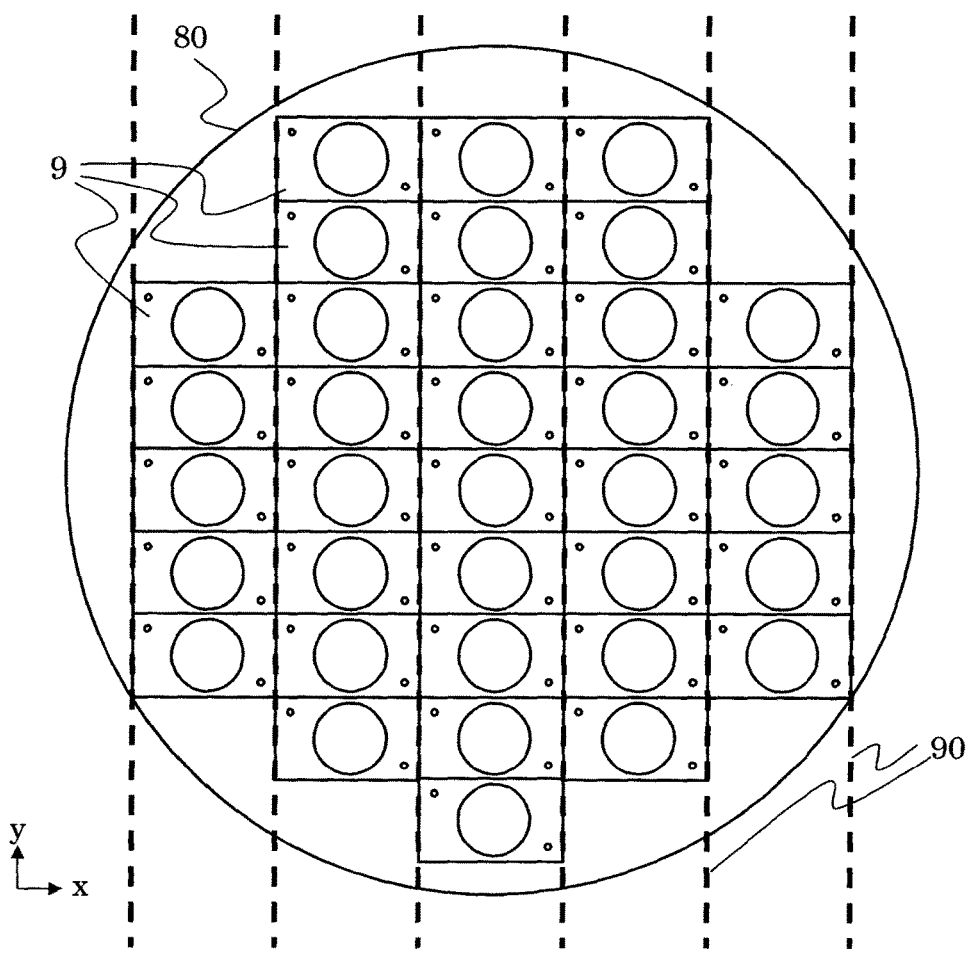
FIG. 1 a schematic illustration of a wafer comprising a multitude of semi-finished objects, in a top view.

FIG. 1 is a schematic illustration of a wafer 80 comprising a multitude of semi-finished objects 9, in a top view. FIG. 1 shows a lateral plane. Therein, the coordinates x and y are located, whereas the vertical direction (z) is perpendicular to the drawing plane.

Various processes may have been applied to wafer 80 in order to produce semi-finished objects 9. Semi-finished objects 9 may, e.g., be optical systems or other systems or elements or items, such as MEMS or microelectronic devices or opto-electronic modules or others mentioned elsewhere in the present patent application.

Figure 2:
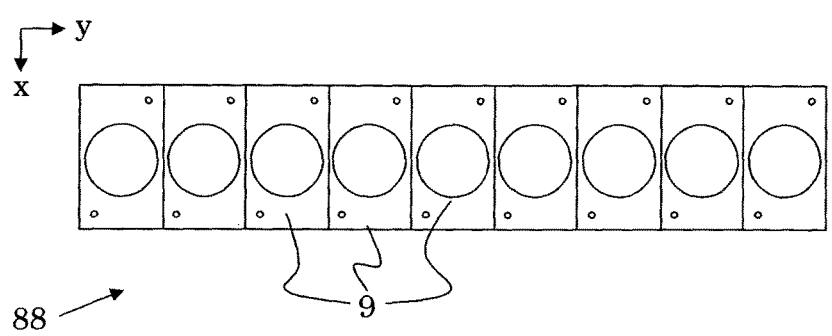
FIG. 2 a schematic illustration of a sub-wafer as obtainable from the wafer of FIG. 1, in a top view.

In conventional wafer-level processing, wafer 80 would be separated, e.g., by sawing, not only along separating lines (sometimes also referred to as "dicing streets") 90, but also along lateral lines perpendicular thereto (not shown in FIG. 1). The result would be numerous separated semi-finished objects 9, i.e. semi-finished objects which are not connected to each other anymore. In fact, the semi-finished objects in that case might rather be "objects" or finished objects. It is suggested, however, to produce, in the separating step in which separation takes place along separation lines 90 only, wafer parts comprising two or more semi-finished objects 9. These wafer parts will be referred to as sub-wafers 88. FIG. 2 is a schematic illustration of a sub-wafer 88 as obtainable from the wafer of FIG. 1, in a top view. So-obtained sub-wafers 88 can be subjected to further processing steps before finally separating the sub-wafers into numerous separated objects, i.e. objects not connected to each other.

FIG. 3 is a schematic illustration of another wafer 80 comprising a multitude of semi-finished objects 9, but in a perspective view. FIG. 4 is a schematic illustration of a sub-wafer as obtainable from the wafer of FIG. 3, in a perspective view. In FIGS. 3 and 4, the thickness (extension in z-direction) of wafer 80 and sub-wafer 88, respectively, is drawn rather large, larger than typically will be the case, but in particular if wafer 80 is composed of several wafers ("wafer stack"), lateral-to-vertical dimensional proportions may be similar to what is illustrated in FIGS. 3 and 4. In particular in case of micro-optic and micro-mechanical objects, such "thick" wafers 80 may be of interest.

FIG. 5 is a schematic illustration of a sub-wafer 88, in a perspective view, which has more common lateral-to-vertical dimensional proportions.

As illustrated in FIG. 4, the semi-finished objects 9 of a sub-wafer 88 are usually aligned along a straight line 20 which is aligned parallel to a side wall 30 or separation face 30 of the sub-wafer 88. Separation face 30 originates from the separation process for obtaining sub-wafers 88 from wafer 80.

FIG. 6 is a schematic illustration of a processed sub-wafer 88, in a perspective view. One separation face 30 (shown on the left in FIG. 6) may remain unprocessed, but processing steps have been applied to the opposite separation face (shown on the left in FIG. 6). That separation face has been polished so as to become a slanted or inclined side wall 30', and in addition, optical structures 50 such as lens elements have been applied to the polished side wall 30'. In a process such as the polishing, it is possible to apply processing simultaneously to several or to all semi-finished objects of a sub-wafer. But, as it may be the case for the application of optical structures to semi-finished objects, which may be accomplished using embossing and curing, processes may be subsequently applied to several or to all semi-finished objects in a sub-wafer.

Although for many applications, all sub-wafers will be subjected to the same processing steps—usually in order to finally manufacture like objects—it is also possible to subject at least one of the sub-wafers to a different processing. E.g., one could polish different sub-wafers (and, at the end, objects) having processed side walls 30' of different inclination angles.

When all the processing to be applied to sub-wafer 88 has been applied, the next step will usually be to separate sub-wafer 88 into objects. This (second) separating process will then be carried out along dicing streets indicated by the arrows in FIG. 6.

FIG. 7 is a schematic illustration of another wafer 80 comprising a multitude of semi-finished objects 9, in a top view. In this case, wafer 80 is of rectangular shape (laterally). FIG. 8 is a schematic illustration of a sub-wafer 88 as obtainable from the wafer of FIG. 7, in a top view. When, after some processing, sub-wafer 88 is separated into parts constituting an object or finished object each, separation can take place along separating lines 90'.

Using FIGS. 7 and 8, it is also explained that processing steps applied to a sub-wafer 88 may concern only a portion of the semi-finished objects 9 comprised therein, e.g., when a step such as a polishing step is applied to the left side wall of the sub-wafer 88 of FIG. 8 only. And FIGS. 7 and 8 are also used to explain that it is possible to process one portion of semi-finished objects 9 in sub-wafer 88 differently from another portion of semi-finished objects 9 in sub-wafer 88, e.g., when the left and the right side walls (separation faces) of the sub-wafer 88 in FIG. 8 are polished to produce different inclination angles. And, using FIGS. 7 and 8, it is also explained that it is possible to provide different sorts of semi-finished objects in a sub-wafer 88, i.e. semi-finished objects which were produced using different processing steps, e.g., if those semi-finished objects shown in FIG. 8 with their triangular tip facing to the right are different from those semi-finished objects shown in FIG. 8 with their triangular tip facing to the left; and these may be equally or differently processed (on sub-wafer level).

Figure 9:
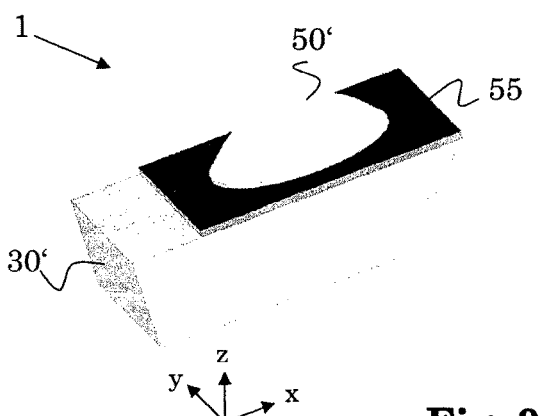
FIG. 9 a schematic illustration of an object, in a perspective view.

FIG. 9 is a schematic illustration of an object 1, in a perspective view. Such an object 1 may be manufactured starting from a transparent wafer, e.g., a wafer of glass or of a transparent polymer. Thereon, a coating has been applied, e.g., using a lithographic technique, which finally resulted in coating 55 visible in FIG. 9. And, optical structures 50' one of which is visible in FIG. 9 have been applied to the wafer, one for each object to be manufactured. Then, the so-obtained wafer has been separated into sub-wafers. These sub-wafers have then been polished at both separation faces, so as to obtain optical grade inclined side walls of different inclination angles. Finally, the sub-wafers have been separated into a plurality of objects 1 like the one shown in FIG. 9. The processed side wall 30' of object 1 has, in FIG. 9, a smaller inclination angle than the opposite processed side wall.

Figure 10:
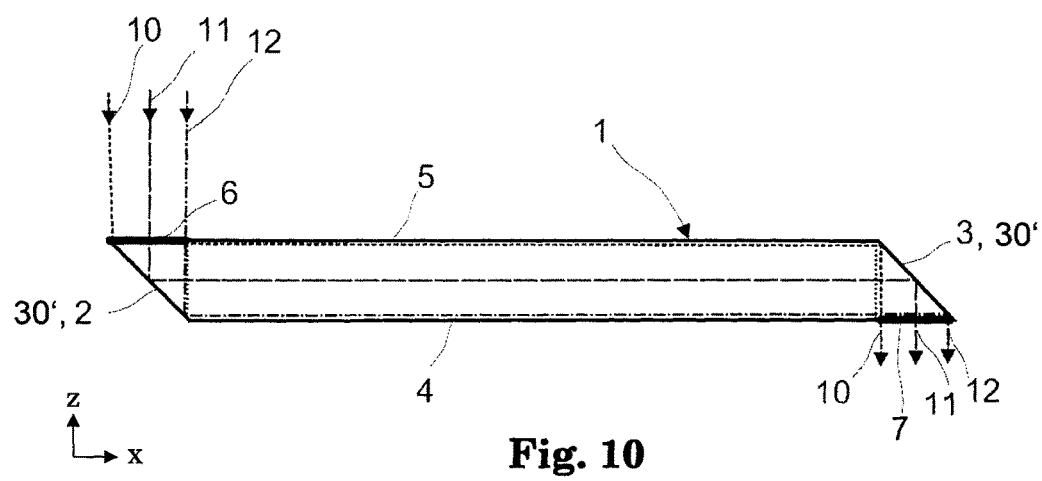
FIG. 10 a schematic illustration of an object, in a cross-sectional view.

FIG. 10 is a schematic illustration of another object 1, in a cross-sectional view. This object 1 is an optical light guide element as may be manufactured using sub-wafer techniques, in particular wherein inclined surface 2 of a first end section of object 1 of FIG. 10 and inclined surface 3 of a second end section of object 1 of FIG. 10 have been produced on sub-wafer level, i.e., by polishing, in a common process, side walls of a plurality of semi-finished objects comprised in a sub-wafer. The wafer that has been divided into sub-wafers can be a wafer of transparent material (such as glass or a transparent polymer) which has been coated, e.g., with a metal, e.g., by sputtering, and then undergone a lithographic process for structuring the coating, e.g., forming, for each semi-finished light guide element, a light entrance area 6 and a light exit area 7.

Figure 11:
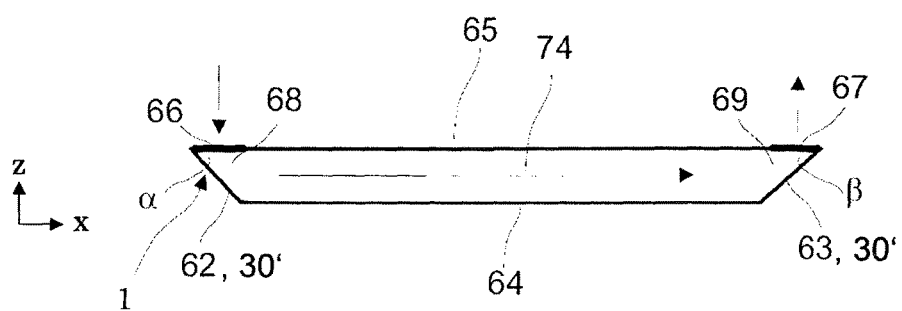
FIG. 11 a schematic illustration of an object, in a cross-sectional view.
Figure 12:
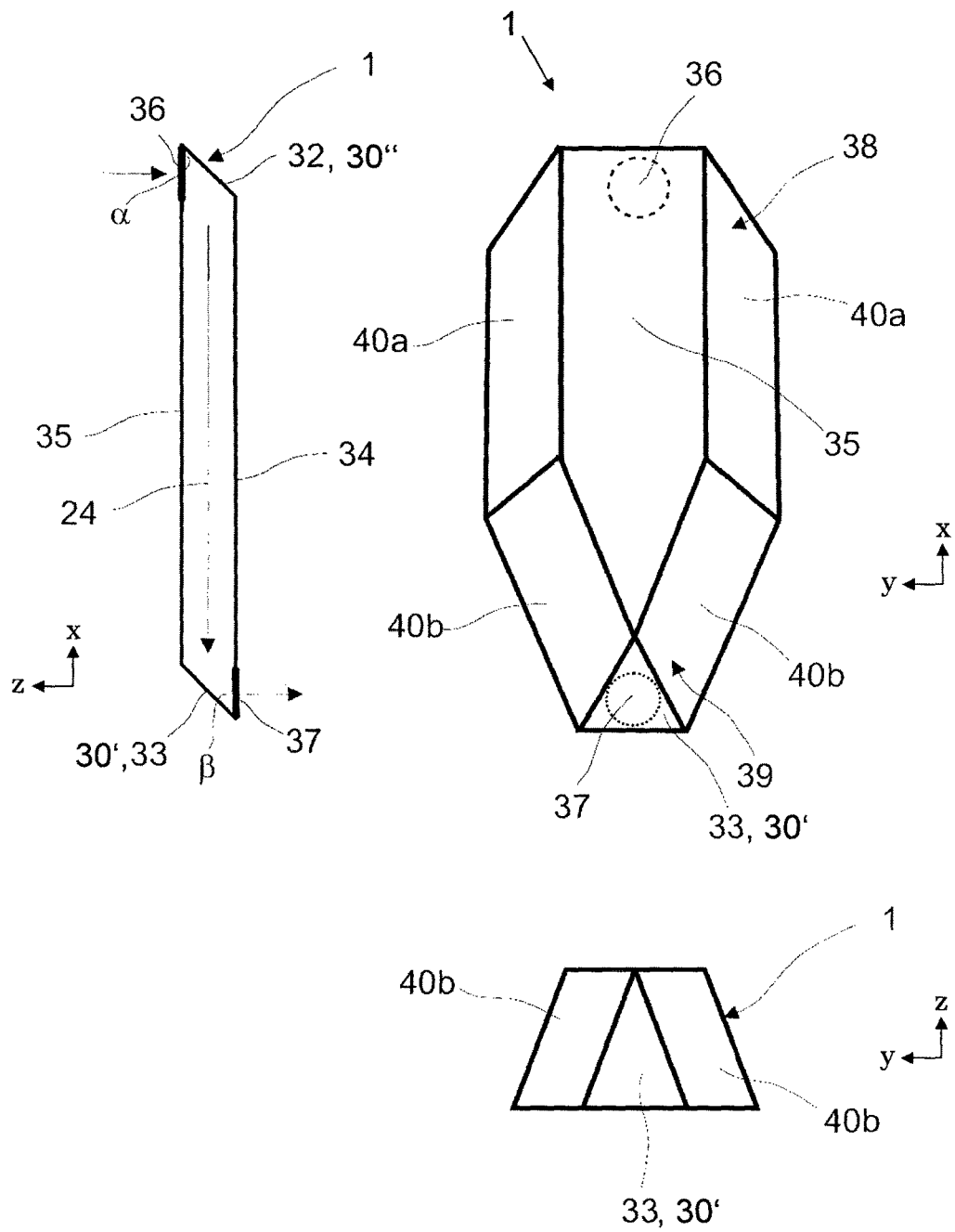
FIG. 12 a schematic illustration of an object, in a cross-sectional view, in a top view and in a front view.

Note that coatings are not drawn in FIGS. 10, 11 and 12.

In FIG. 10, also the functioning of the light guide element for a certain light incidence angle is illustrated. Three light beams 10, 11 and 12 are illustrated, entering the light guide element in light entrance area 6, propagating through the light guide element and leaving it through light exit area 7. For other light incidence angles, reflection of light beams at (coated) surfaces 4 and 5 of the light guide element may take place before the light exits the light guide element at light exit area 7.

FIG. 11 is a schematic illustration of another object 1, in a cross-sectional view. Also, this is a light guide element and may be manufactured using the proposed sub-wafer level techniques, namely in particular for producing, as processed (polished) separation faces 30', inclined surfaces 62 and 63 forming angles a and 13, respectively, e.g., both amounting to 45 degrees. Using arrows indicating the main direction 74 of light propagation, in FIG. 11, a light path of light entering the light guide element at a light entrance area 66 at a first end section 68 of the light guide element and leaving the light guide element at a light exit area 67 at a second end section 69 of the light guide element is illustrated.

Surfaces 64 and 65 may, in case of different light incidence angles, reflect the light within the light guide element. The manufacture of a light guide element as shown in FIG. 11 may start with a transparent wafer which then is coated on both sides, e.g., with a reflective coating, and then provided with openings in the coating by lithographically etching and thus forming light entrance area 66 and light exit area 67 for each object.

FIG. 12 is a schematic illustration of yet another object 1, in a cross-sectional view (upper left of FIG. 12), in a top view (upper right of FIG. 12) and in a front view (lower right of FIG. 12). This object 1 is a light guide element of rather complex shape. It may be manufactured starting from a blank transparent glass or polymer wafer which is on both sides provided with a coating such as a sputtered aluminum reflective coating which then is selectively etched using lithography for forming transparent light entrance areas 36. It is possible to form lenses (not shown in FIG. 12) on the light entrance areas 36, e.g., using a replication technique such as embossing. All this can be done on wafer level before a separating step is carried out. Then, the wafer comprising a multitude of semi-finished light guide elements each comprising a coating and a light entrance area 36 with a lens thereon, is divided into several sub-wafers. On sub-wafer level, inclined side faces 33 are produced by polishing the separation faces and thus obtaining processed side walls 30'. These may, still on sub-wafer level, be provided with a coating such as a reflective coating and with light exit areas 37, e.g., using etching and lithography.

Also still on sub-wafer level, processed side walls 30" may be accomplished by polishing a separation face, thus obtaining inclined surfaces 32.

Further faces of the object 1 of FIG. 12, such as faces 40a, 40b, may be formed on wafer level, on sub-wafer level, or after obtaining single light guide elements in a final separation step. In the upper left portion of FIG. 12, a main direction 24 of light propagation is indicated by a straight arrow, and light entering the light guide element at light entry area 36 at the first end section 38 of the light guide element as well as light exiting the light guide element at light exit area 37 at the second end section 39 of the light guide element is indicated by the two other (shorter) straight arrows. The two wafer-level coated surfaces are referenced 34 and 35, respectively.

The light guide elements or objects 1 illustrated in FIGS. 10, 11 and 12 are in greater detail described in the U.S. provisional application with Ser. No. 61/418,017 filed on Nov. 30, 2010 as well as in the PCT application published as WO 2012/071674 A1; FIG. 10 in these is FIG. 2d, FIG. 11 corresponds to FIG. 4, and present FIG. 12 corresponds to FIGS. 3a to 3c therein. Therefore, said U.S. provisional application with Ser. No. 61/418,017 and said PCT application published as WO 2012/071674 A1 are herewith incorporated by reference in the present application. Furthermore, also other light guide elements described in said U.S. provisional application with Ser. No. 61/418,017 or in said PCT application published as WO 2012/071674 A1 may be manufactured making use of the herein described sub-wafer level technique. Also for this reason, said U.S. provisional application with Ser. No. 61/418,017 and said PCT application published as WO 2012/071674 A1 are herewith incorporated by reference in the present application.

Figure 13:
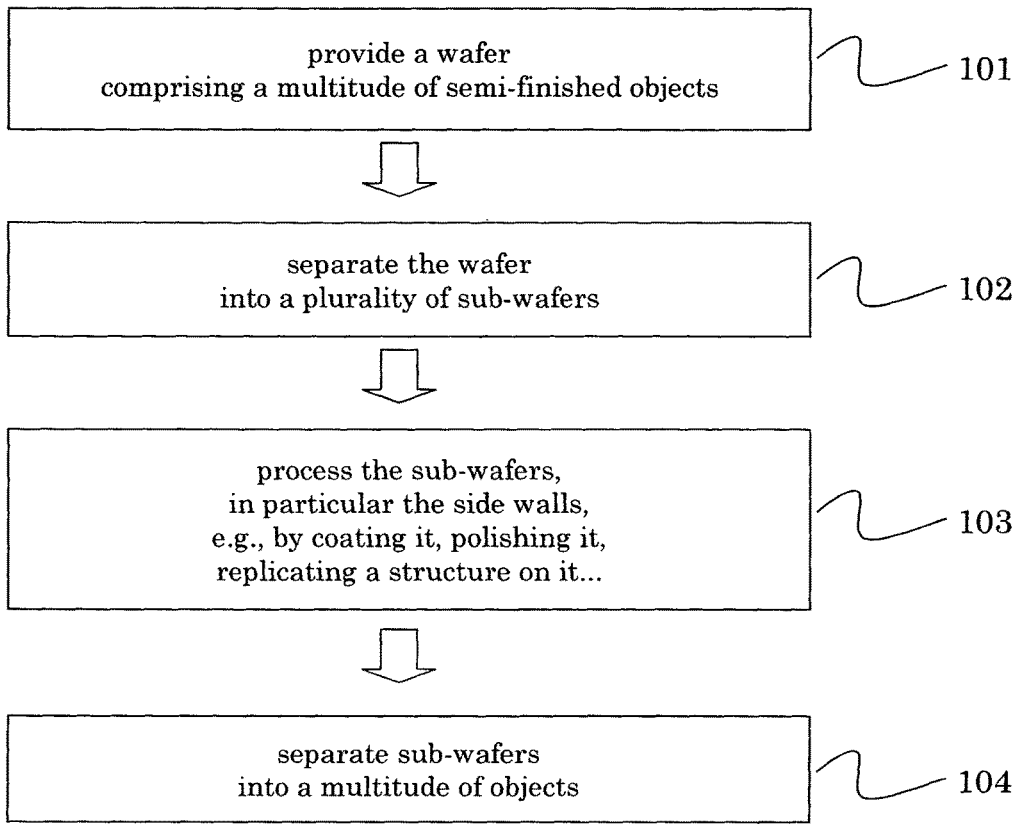
FIG. 13 an illustration of a manufacturing method.

FIG. 13 is an illustration of a manufacturing method. In step 101, a wafer is provided. The wafer comprises a multitude of semi-finished products obtained involving carrying out, e.g., one or more of lithographic processes, replication processes, coating processes, mechanical processes, etching processes, polishing processes and/or others.

In step 102, the wafer is divided into sub-wafers, e.g., by punching, sawing, cutting, or laser cutting, a sub-wafer comprising one or more, usually a plurality of said semi-finished products. Then, in step 103, the sub-wafers are (or at least one of them is) processed, wherein the processing may comprise one or more of lithographic processes, replication processes, coating processes, mechanical processes, etching processes, polishing processes and/or others. Then, the processed one or more sub-wafers are separated into a multitude of objects. The so-obtained objects may be used as obtained in step 104 or may be subjected to further processing, e.g., to a packaging process or to a mounting process in which the object is mounted to another element or device.

Figure 14:
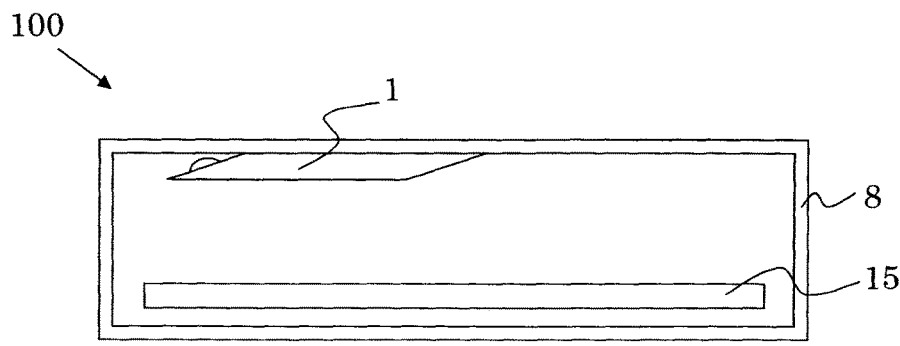
FIG. 14 a schematic illustration of a device comprising an object.

FIG. 14 is a very schematic illustration of a device 100 comprising an object 1 such as, e.g., a light guide element, wherein a different object 1 manufactured according to the invention could also be comprised in device 100. Device 100 comprises a housing 8 and device electronics 15, e.g., a printed circuit board 15. Object 1 is arranged in object 100, more particularly, it is mounted in and at housing 8. Device electronics 15 comprises electronic and/or electro-optic components (not shown) one or more of which may interact with object 1. Device 100 can be, e.g., an electro-optic device, a photographic device, a portable communication device, a portable music player, or another device, e.g., one of those described in the present patent application.

The invention claimed is:

1. A method for manufacturing an object, the method comprising the steps of:
   (a) providing a wafer comprising semi-finished objects;
   (b) separating said wafer into sub-wafers, at least one of said sub-wafers comprising a plurality of said semi-finished objects;
   (c) processing at least a portion of said plurality of semi-finished objects by subjecting said at least one of said sub-wafers to at least one processing step, wherein said at least one processing step is applied to a separation face of said sub-wafer originating from step (b).

2. The method according to claim 1, wherein said portion comprises at least two of said plurality of semi-finished objects.

3. The method according to claim 1, wherein said portion comprises at least half of said plurality of semi-finished objects.

4. A method for manufacturing an object, the method comprising the steps of:
   (a) providing a wafer comprising semi-finished objects;
   (b) separating said wafer into sub-wafers, at least one of said sub-wafers comprising a plurality of said semi-finished objects;
   (c) processing at least a portion of said plurality of semi-finished objects by subjecting said at least one of said sub-wafers to at least one processing step, wherein said at least one processing step comprises creating a slanted side wall of said sub-wafer slanted with respect to a lateral plane, wherein creating said slanted side wall is accomplished by removing material from said sub-wafer.

5. The method according to claim 4, wherein step (c) is carried out while said plurality of said semi-finished objects is comprised in said sub-wafer.

6. The method according to claim 4, wherein in step (c),
   all the semi-finished objects of said portion of said plurality of semi-finished objects are simultaneously processed; or
   the semi-finished objects of said portion of said plurality of semi-finished objects are subsequently processed.

7. The method according to claim 4, wherein in step (c), each of said semi-finished objects of said at least one sub-wafer is processed by subjecting said at least one sub-wafer to at least one processing step.

8. The method according to claim 4, wherein each of at least two of said sub-wafers comprises a respective plurality of said semi-finished objects, wherein the method comprises carrying out for each respective one of said at least two sub-wafers, the step of (c') processing at least a portion of the respective plurality of semi-finished objects of the respective sub-wafer by subjecting the respective sub-wafer to said at least one processing step.

9. The method according to claim 4, wherein in said at least one sub-wafer, said plurality of said semi-finished objects forms a repetitive one-dimensional arrangement of said semi-finished objects.

10. The method according to claim 4, wherein in said at least one sub-wafer, said plurality of said semi-finished objects is arranged along one or two straight lines.

11. The method according to claim 4, wherein said at least one processing step comprises at least one of the group consisting of
- a replication step;
- a mechanical processing step;
- a polishing step;
- a grinding step;
- a cutting step;
- a chemical processing step;
- a lithographic step;
- a coating step; and
- an etching step.

12. The method according to claim 4, wherein said object is at least one of the group consisting of:
- an optical element;
- an optical device;
- a substrate comprising at least one slanted face;
- an optical sub-assembly comprising a substrate on which a light emitter is mounted, wherein said substrate on which a light emitter is mounted has at least one slanted face and/or wherein said light emitter is an edge-emitting light emitter and/or a laser;
- an opto-electronic module;
- an optical system;
- a light-guiding device;
- a micro-mechanical element;
- a micro-electro-mechanical element;
- a micro-electro-mechanical system.

13. The method according to claim 4, wherein said wafer is at least partially made of a transparent polymer or of a glass.

14. The method according to claim 4, comprising carrying out, after carrying out step (c), the step of (d) separating said at least one sub-wafer into a plurality of parts, wherein each part comprises one of said processed semi-finished objects.

15. The method according to claim 4, comprising carrying out, before carrying out step (b), the step of (e) manufacturing said wafer.

* * * * *